(12) United States Patent
Jiang et al.

(10) Patent No.: US 8,709,862 B2
(45) Date of Patent: *Apr. 29, 2014

(54) VANADIUM, COBALT AND STRONTIUM ADDITIVES FOR USE IN ALUMINUM BACK SOLAR CELL CONTACTS

(75) Inventors: Hong Jiang, Irvine, CA (US); Chandrashekhar S. Khadilkar, Broadview Heights, OH (US); Nazarali Merchant, San Diego, CA (US); Srinivasan Sridharan, Strongsville, OH (US); Aziz S. Shaikh, San Diego, CA (US)

(73) Assignee: Heraeus Precious Metals North America Conshohocken LLC, West Conshohocken, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/342,334

(22) Filed: Jan. 3, 2012

(65) Prior Publication Data

US 2012/0178207 A1     Jul. 12, 2012

Related U.S. Application Data

(60) Provisional application No. 61/430,201, filed on Jan. 6, 2011.

(51) Int. Cl.
*H01L 21/00*     (2006.01)

(52) U.S. Cl.
USPC ... 438/98; 136/256; 257/E21.627; 257/E21.641

(58) Field of Classification Search
USPC ............... 136/256; 438/98; 257/E21.627, 257/E21.641
See application file for complete search history.

(56) References Cited

U.S. PATENT DOCUMENTS

| | | | |
|---|---|---|---|
| 8,309,844 B2 * | 11/2012 | Merchant et al. ......... | 136/256 |
| 2006/0102228 A1 | 5/2006 | Sridharan et al. | |
| 2006/0289055 A1 | 12/2006 | Sridharan et al. | |
| 2009/0056798 A1 | 3/2009 | Merchant et al. | |
| 2009/0101190 A1 | 4/2009 | Salami et al. | |
| 2011/0232747 A1 * | 9/2011 | Mikeska et al. ......... | 136/256 |
| 2012/0031484 A1 * | 2/2012 | Matsuno et al. ......... | 136/256 |
| 2012/0152342 A1 * | 6/2012 | Roelofs ......... | 136/256 |
| 2012/0174974 A1 * | 7/2012 | Khadilkar et al. ......... | 136/256 |
| 2012/0186647 A1 * | 7/2012 | Merchant et al. ......... | 136/256 |

* cited by examiner

*Primary Examiner* — Asok K Sarkar
(74) *Attorney, Agent, or Firm* — Blank Rome LLP

(57) ABSTRACT

Al pastes with additives of Co, Sr, V, compounds thereof and combinations thereof improve both the physical integrity of a back contact of a silicon solar cell as well as the electrical performance of a cell with such a contact.

28 Claims, 2 Drawing Sheets

VANADIUM, COBALT AND STRONTIUM ADDITIVES FOR USE IN ALUMINUM BACK SOLAR CELL CONTACTS

FIELD OF THE INVENTION

This invention relates to vanadium, cobalt and strontium compounds additions to back contact aluminum pastes to improve the electrical performance of a contact made from a fired paste. The vanadium, cobalt, and strontium compounds and combinations thereof react—with aluminum or aluminum alloys in a back contact to ensure more reliable and uniform back contacts for improved cell electrical performance. Further, they react exothermically with aluminum or aluminum alloys or glass flits in a back contact film that lead to increased wafer temperature that ensures more reliable and uniform formation of back contacts.

BACKGROUND

Solar cells are generally made of semiconductor materials, such as silicon (Si), which convert sunlight into useful electrical energy. A solar cell contact is in generally made of thin wafers of Si in which the required pn junction is formed by diffusing phosphorus (P) from a suitable phosphorus source into a p-type Si wafer (for example boron doped Silicon wafer) to form n-type region. The side of the silicon wafer on which sunlight is incident (n-side) is generally coated with an anti-reflective coating (ARC) to prevent reflective loss of sunlight. This ARC increases the solar cell efficiency. A two dimensional electrode grid pattern known as a front contact makes a connection to the n-side of silicon, and a coating of predominantly aluminum (Al) makes connection to the p-side of the silicon (back contact). Further, contacts known as silver rear contacts, made out of silver or silver-aluminum paste are printed and fired on the N-side of silicon to enable soldering of tabs that electrically connect one cell to the next in a solar cell module. These contacts are the electrical outlets from the pn junction to the outside load.

The additives described in this invention react with Al to form reliable and high efficiency back contacts. The reactions between additives and Al results in an earlier onset of removal of the thin surface oxide layer on Al particulates. The Al pastes containing the additives described hereinbelow offers a wider processing window and higher electrical performance.

SUMMARY OF THE INVENTION

The invention describes a role played by vanadium, cobalt, and strontium compounds to improve the aluminum back contacts to silicon solar cells. In particular, additions of vanadium, cobalt and strontium compounds react with aluminum and silicon in order to form a highly efficient solar cell contact. The cell improvements are reflected in cell efficiency (Eff), fill factor (FF), cell open circuit voltage, (Voc) and cell short circuit current, (Isc). Electrical performance of solar cells made therewith, as measured by low series resistance ($R_S$), high shunt resistance ($R_{sh}$) and high efficiency ($\eta$) are also facets of the invention.

In particular, an embodiment of the invention is the formation of a composition of Al paste comprising Aluminum, together with at least one compound of a metal selected from the group consisting of Co, Sr, V and combinations thereof.

In particular, an embodiment of the invention is a method of improving the electrical performance of an aluminum back contacted silicon solar cell, comprising: (a) providing a silicon wafer substrate, (b) applying to the substrate a paste comprising aluminum glass and at least one compound of a metal selected from the group consisting of Co, Sr, V and combination thereof to form a coated substrate, and (c) firing the coated substrate.

Still another embodiment of the invention is a method of reducing the reaction onset temperature of a conductive paste sintering reaction, comprising: (a) providing a silicon wafer substrate; (b) providing a paste comprising: (i) aluminum, (ii) glass frit, and (iii) a separate and distinct amount of at least one additive, (iv) such that, together with the aluminum, the glass frit and additive forms a paste (c) applying the paste to the silicon wafer substrate to form a coated substrate, and (d) firing the coated substrate for a time and at a temperature sufficient to sinter the aluminum and fuse the glass frit and additive, wherein the combination of aluminum, glass frit and at least one additive is such that the sintering temperature of the paste is at least 3° C. lower than it would otherwise be if the at least one additive were not present.

Still another embodiment is a solar cell comprising, prior to firing, (a) a silicon wafer substrate; (b) a paste comprising (i) aluminum, (ii) glass frit, and (iii) an amount of at least one additive, wherein the combination of aluminum, glass frit and at least one additive is such that the sintering temperature of the paste is at least 5° C. lower than it would otherwise be if the at least one additive were not present. In another embodiment, the sintering temperature is at least 3° C. lower than it would otherwise be if the at least one additive were not present.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

Figure 1:
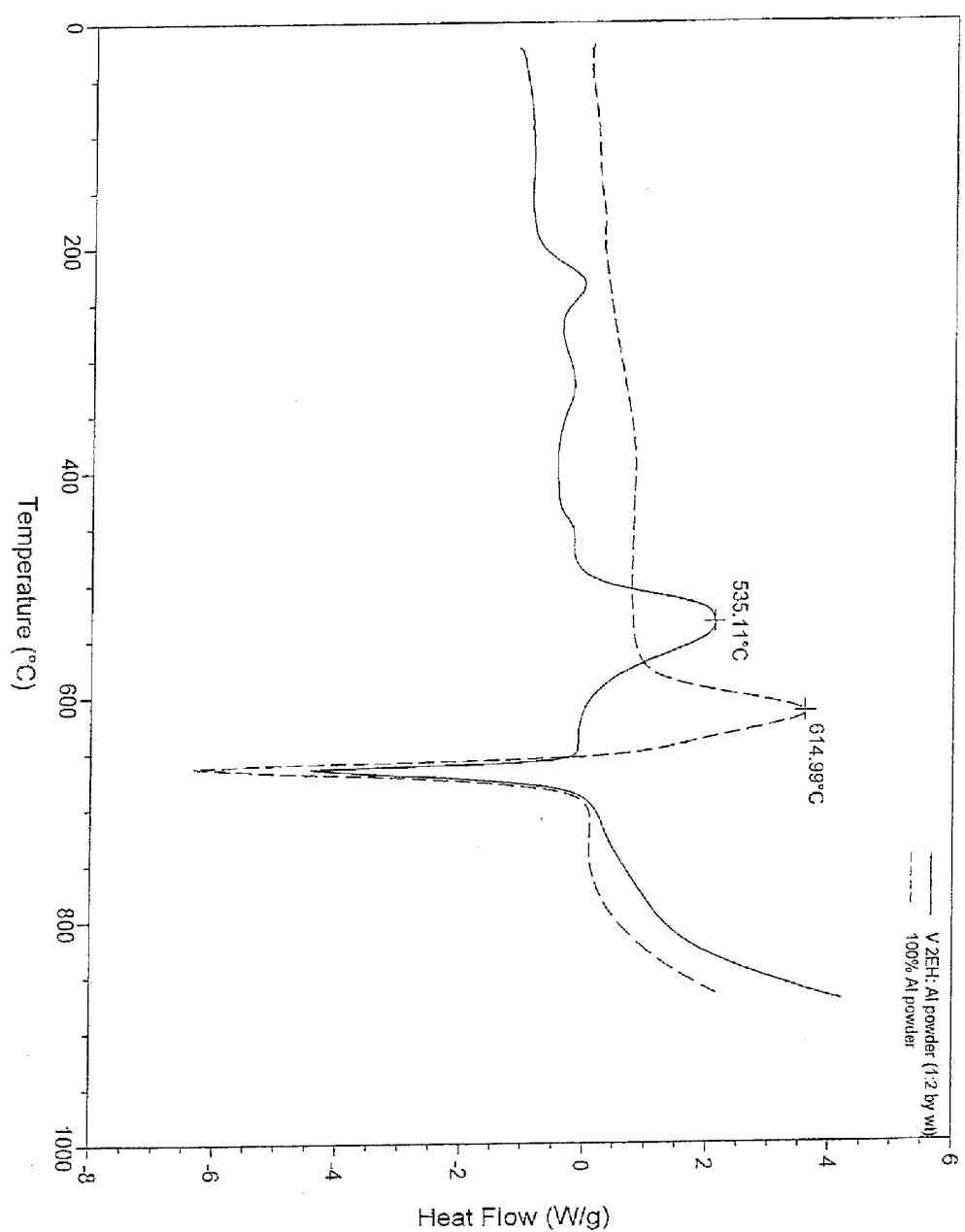
FIG. 1. Overlay DSCs of 1:2 Vanadium 2-ethylhexanoate: Aluminum powder and Al powder alone.

Broadly, the invention provides a solar cell comprising a contact. The contact is made from a mixture wherein prior to firing, the mixture comprises at least one aluminum source, and about 0.1 to about 10 wt % of a glass component. The content of aluminum is about 60 wt % to about 95 wt % of the mixture.

The aluminum back contact of a solar cell makes contact with both the silicon wafer and the Ag/Al rear contact layer. In a back contact, the metal component preferably comprises aluminum, and the glass component may be one of several types. Bismuth based glasses, borosilicates, and alkali titanium silicate glasses each have certain advantages over the prior art when used in a solar cell back contact.

Broadly, thick film pastes containing aluminum and glass frit are used to make back contacts for silicon-based solar cells to conduct to an external load the current generated by exposure to light. While the paste is generally applied by screen-printing, methods such as extrusion, pad printing, ink jet printing, and hot melt printing may also be used. Further with suitable organics modifications the mixture of the present invention could be applied by tape lamination techniques, as taught in commonly owned U.S. Pat. No. 7,547, 369. Solar cells with screen-printed front contacts are fired to relatively low temperatures (550° C. to 850° C. wafer temperature; furnace set temperatures of 650° C. to 1000° C.) to form a low resistance contact between the p-side of an aluminum doped silicon wafer and an aluminum based paste. Methods for making solar cells are also envisioned herein.

Aluminum- and glass-containing back contacts are used to form low resistance ohmic contacts on the back side of the solar cell due to large area melting and resolidification of Al doped ($p^+$) epitaxially grown Si layer which increases the solar cell performance due to the production of an improved back surface field. For optimum performance a thick $p^+$ re-grown region is believed to be ideal. It is also believed that the rejection of metallic impurities from the epitaxially growing $p^+$ layer leads to high carrier lifetimes. These two factors are believed to increase the open circuit voltage, and more importantly, the open circuit voltage falls only slightly as the bulk resistivity increases. Therefore solar cell performance improves due to the formation of a substantial epitaxially re-grown $p^+$ layer in the Al back contact.

During crystalline silicon solar cell manufacturing, front silver based paste is applied to n-type silicon (phosphorus doped region) and aluminum back contact paste is applied to p-type (boron doped region) silicon. The back contact aluminum plays a key role in (1) improving the cell open circuit voltage, Voc; (2) in increasing the cell current by reducing the back contact recombination velocity, $S_{eff}$, by formation of a back surface field, BSF layer; and (3) also acts as a reflector for the unabsorbed light. All these factors lead to improvements in the overall cell efficiency and other electrical parameters. In solar cell manufacturing, front and back contact pastes are applied to the wafer (generally by screen printing) and dried. Both front contact silver and back contact aluminum pastes are fired at the same time in a belt furnace at ca. 900° C. furnace set temperature at very rapid rate (180-240 ipm) and the time at the peak firing temperature is of the order of only 1-10 seconds.

For a back contact, upon firing, a $p^+$ layer forms on the underlying silicon by liquid-phase epitaxy. This occurs during the resolidification of the aluminum-silicon (Al—Si) melt. High-bismuth lead-free and cadmium-free glasses allow low firing temperatures in making front contacts owing to their excellent flow characteristics relatively at low temperatures. Alkali-titanium-silicate glasses are another route to attain lower firing temperatures. While lead-glasses are often avoided for environmental reasons, they are sometimes used because they are the only route at present to certain properties, such as extremely low melting and wetting glasses. Relatively high-silicon, low bismuth lead-free and cadmium-free glasses provide suitable properties for back contacts, without excessive interaction with backside Si. Similarly, high-bismuth lead-free and cadmium-free glasses allow the formation of suitable lead-free silver rear contacts on backside Si with optimal interaction with both Si and back contact Al layer.

The additives of the invention provide heat to the aluminum paste through exothermic reactions which reduce reaction onset temperature(s) in order to form more reliable and high efficiency front and back contacts. Higher and more uniform back contact reaction temperature has following beneficial effects: (1) increases the thickness of the BSF layer; (2) increases the "doping" level of aluminum in the BSF layer; (3) makes the wafer temperature more uniform and improves the temperature distribution in the wafer—heat generated by localized exothermic reaction is very effectively distributed by high thermal conductivity molten aluminum metal or aluminum alloys; (4) improves the aluminum paste adhesion to silicon and (5) improves the front contact formation. This control of temperature and its uniformity is critical for other types of back contacts also where aluminum is applied over thin coatings of $Al_2O_3$, $SiO_2$, $Si_3N_4$ or their combinations as a continuous film or where via openings are made to make aluminum silicon contact.

The inventors herein have determined, by the use of Differential Thermal Analysis (DTA), Differential Scanning Calorimetry (DSC) X-Ray diffraction study (XRD) and Scanning Electron Microscopy (SEM), the various parameters under which molten aluminum reacts with the glass constituent and additives.

The present invention involves addition of inorganic compounds or organometallic compounds or mixtures thereof that reacts exothermically with molten aluminum metals or aluminum-silicon alloy (including Al-silicon eutectic alloy) or other aluminum alloys on solar cell substrates during firing to make solar cell contacts.

The additives described in this invention react with Al to form reliable, high-efficiency back contacts. The reactions between additives and Al results in earlier onset of removal of the thin surface oxide layer on Al powder. DSC Analysis of vanadium 2-ethylhexanoate and Al mixture shows that vanadium 2-ethylhexanoate is able to reduce the temperature at which alumina is removed by 80° C. The Al pastes containing the additives described in this invention offer wider processing window, better BSF formation and higher Voc.

The present invention involves addition of vanadium, cobalt, and strontium compounds or mixtures thereof that react with aluminum metals or aluminum-silicon alloys (including Al-silicon eutectic alloy) or other aluminum alloys on solar cell substrates during firing to make solar cell contacts.

The invention further involves addition of inorganic compounds or organometallic compounds or mixtures thereof that react with molten aluminum metal or aluminum-silicon alloy (including Al-silicon eutectic alloy) or other aluminum alloys in the temperature range of 400 to 950° C. The invention further involves addition of inorganic compounds or organometallic compounds, hydrocarbon resins or mixtures thereof that react exothermically with molten aluminum metals or aluminum-silicon alloy (including Al-silicon eutectic alloy) or other aluminum alloys in the temperature range of 400 to 950° C. or 500 to 850° C. or 550 to 950° C. or 650 to 850° C.

The invention demonstrates that compounds of cobalt, strontium or vanadium combinations thereof in various forms (including the elemental metals), which upon reacting with molten aluminum metal during solar cell contact firing will provide excess heat which helps to form a better aluminum to silicon contact.

A mixing method is envisioned where glass or a mixture of glasses and compounds of cobalt, strontium or vanadium or mixtures of oxides and/or clays and/or silicate minerals (which are mixtures of various oxides) and/or pigments are well mixed with a sufficient amount of aluminum powder to have intimate contact between the reacting system i.e., aluminum and reactive additive. This mixture is added to the aluminum paste to generate uniform heat and improve aluminum paste contact properties.

The present invention provides an aluminum paste for application to a silicon solar cell having a p+ and n+ layer for the formation of a back-surface-field (BSF) and an emitter. Addition of various additives to aluminum during firing provides additional heat to more thoroughly and uniformly sinter the contact.

The additions of Co, V, or Sr, increase firing temperature as well as uniformity of firing temperature in order to form a highly efficient solar cell contact. Electrical performance of solar cells made therewith, as measured by high efficiency (η) and high fill factor (FF), are also a facet of the invention.

Generally, the present invention includes a solar cell comprising a contact. The contact is made from a mixture wherein prior to firing, the mixture comprises at least one aluminum source, and about 0.1 to about 10 wt % of a glass component. The content of aluminum is about 60 wt % to about 95 wt % of the mixture.

The compositions and methods of the present invention overcome the drawbacks of the prior art by optimizing interaction, bonding, and contact formation between back contact (BSF) components, typically silicon with Al through a properly formulated aluminum paste. A conductive paste containing aluminum and a glass component is printed on a silicon substrate, and fired to fuse the glass, sinter the metal, and provide aluminum doping into the silicon wafer to a depth of several microns. One or more modifying cobalt, strontium or vanadium additives is added to the paste prior to firing in order to initiate a reaction to form a back contact including a p+ layer, which is overlaid by an Al—Si eutectic layer, and which in turn is overlaid by aluminum layer.

The present invention also provides an aluminum paste for application to a silicon solar cell having a p+ and n+ layer for the formation of a back-surface-field (BSF) and an emitter. Addition of the various additives to aluminum enhances reaction between Al and Si to form a better solar cell contact.

Broadly construed, the inventive pastes comprise aluminum, glass as well as a separate and distinct addition of at least one of the vanadium, cobalt and strontium compounds as additives.

Additives. The invention demonstrates that various compounds of cobalt, strontium or vanadium, which upon reacting with aluminum metal and/or glass fit during solar cell contact firing, will provide excess heat and reduce reaction onset temperature, which helps to form a better aluminum to silicon contact. In general, addition of transition metal compounds (organic or inorganic) to an aluminum paste serves to generate heat.

Organometallic compounds having one or more metal centers, with one or more hydrocarbon chains (or hydrocarbon residues) each with 1 to 30 carbons, preferably 1 to 22, more preferably 1 to 18 carbons are useful. An organometallic compound may have 1, 2, 3, 4, 5, or 6 residues, which may be the same or different. Each hydrocarbon residue may have 1-5 carbons, 6-10 carbons, 11-15 carbons, 16-20 carbons, 21-25 carbons or 26-30 carbons. Alternatively each hydrocarbon residue may have 1-7 carbons, 8-12 carbons, 13-17 carbons, 18-22 carbons, 23-27 carbons or 28-30 carbons.

Also useful as additives are other organic residues, for example residues having one or more rings (such as biphenyl), or fused ring structures, such as naphthalene or anthracene. Heteroring systems including heteroatoms such as oxygen, nitrogen, sulfur, phosphorus, or silicon are envisioned. Stearates (monostearates, distearates, tristearates), acetates and acetylacetonates are especially useful. An organometallic compound useful herein may have organic residues with different carbon counts. By way of example only, an organometallic compounds including any of cobalt, manganese, nickel, iron, silicon, tin, antimony, bismuth, vanadium, strontium or combinations thereof with or without additional minerals or glasses are particularly advantageous. The organometallics and inorganic compounds of cobalt, strontium and vanadium have been found by the inventors to be particularly useful in this regard. Metal acetylacetonates or metal acetates are preferred.

Glasses. The pastes comprise about 0.01 to about 10 wt %, preferably about 0.1 to about 5 wt % of a glass component. The glass component comprises, prior to firing, one or more glass compositions. Each glass composition comprises oxide frits including, in one embodiment, $Bi_2O_3$, $B_2O_3$ and $SiO_2$. In another embodiment, the glass composition comprises an alkali oxide, $TiO_2$, and $SiO_2$. In particular, in various embodiments of the present invention, glass compositions for back contacts may be found in Tables 1-2. In formulating the pastes, the glass frits typically have particle sizes of about 0.5 to about 10 microns, although other particle sizes may be used as known in the art.

Looking to Tables 1-2, more than one glass composition can be used, and compositions comprising amounts from different columns in the same table are also envisioned. If a second glass composition is used, the proportions of the glass compositions can be varied to control the extent of paste interaction with silicon and hence the resultant solar cell properties, and to control the bowing of the silicon wafer. For example, within the glass component, the first and second glass compositions may be present in a weight ratio of about 1:20 to about 20:1, and preferably about 1:5 to about 5:1. The glass component preferably contains no lead or oxides of lead, and no cadmium or oxides of cadmium. However, in certain embodiments where the properties of PbO cannot be duplicated, such embodiments advantageously comprise PbO. An entry such as "$Li_2O+Na_2O+K_2O$" means that the total content of $Li_2O$ and $Na_2O$ and $K_2O$ falls within the specified ranges. For example, a range of 5-35 mol % ($Li_2O+Na_2O+K_2O$) includes 15-25 mol % $K_2O$, for example.

TABLE 1

Oxide frit ingredients for contact glasses in mole percent.

|  | Glass I | Glass II | Glass III | Glass IV |
|---|---|---|---|---|
| Bi2O3 | 20-55 |  |  |  |
| Al2O3 |  |  |  | 0.5-2.5 |
| B2O3 | 1-10 | 10-25 |  | 10-30 |
| K2O | 10-35 | 0.5-3.0 | 5-15 | 0.2-2.0 |
| Li2O |  |  | 1-8 |  |
| Na2O |  | 0.01-3.0 | 16-28 | 5-15 |
| P2O5 |  |  | 0.2-8 |  |
| SiO2 | 10-50 | 70-90 | 30-50 | 16-26 |
| TiO2 |  |  | 15-25 | 1-5 |
| V2O5 |  |  | 1-16 |  |
| ZnO |  |  |  | 21-31 |
| ZrO2 |  |  |  | 1-5 |
| F2 |  |  |  | 0.5-15 |

TABLE 2

Oxide frit ingredients for contact glasses in mole percent.

|  | A | B | C | D | E | F | G | H | I | J | K |
|---|---|---|---|---|---|---|---|---|---|---|---|
| $Bi_2O_3$ | 50-70 | 45-75 | 60-90 | 15-40 | 15-55 | 20-50 | 25-45 | 45-75 | 15-55 | 20-50 | 10-40 |
| $SiO_2$ | 25-45 | 20-40 | 10-30 | 25-60 | 15-55 | 20-50 | 25-45 | 20-40 | 15-55 |  | 30-68 |
| ZnO | 2-7 |  |  | 5-15 |  |  |  |  |  | 20-38 |  |
| $B_2O_3$ |  |  |  | 5-15 |  |  |  | 5-15 | 1-15 | 10-25 | 5-15 |

TABLE 2-continued

Oxide frit ingredients for contact glasses in mole percent.

|  | A | B | C | D | E | F | G | H | I | J | K |
|---|---|---|---|---|---|---|---|---|---|---|---|
| $Al_2O_3$ |  | 5-15 |  |  | 1-15 | 2-12 | 3-10 |  |  |  |  |
| $V_2O_5$ |  |  | 1-10 |  |  |  |  |  |  |  |  |
| $Li_2O$ |  |  |  | 5-15 |  |  |  |  |  |  | 1-10 |
| $Na_2O$ |  |  |  | 0.5-5 |  |  |  |  |  |  |  |
| $K_2O$ |  |  |  |  |  |  |  |  |  | 0.1-15 | 1-10 |
| $Li_2O +$ $Na_2O +$ $K_2O$ |  |  |  |  | 5-35 | 10-30 | 15-25 |  | 5-35 |  |  |
| $TiO_2$ |  |  |  |  |  |  |  |  |  |  | 0.1-5 |
| $Nb_2O_5$ |  |  |  | 0.1-5 |  |  |  |  |  |  |  |

Metal Component. Solar cell contacts typically include silver, aluminum or both. In a back contact, the metal component comprises aluminum. The aluminum metal component may come in any suitable form, including aluminum metal powder, an alloy of aluminum, an aluminum salt, and organometallic aluminum, an oxide of aluminum, and an aluminum-containing glass. The aluminum particles used in the paste may be spherical, flaked, or provided in a colloidal suspension, and combinations of the foregoing may be used. In formulating the pastes, the metal powders typically have particle sizes of about 0.1 to about 40 microns, preferably less than 10 microns. For example the paste may comprise about 80 to about 99 wt % spherical aluminum particles or alternatively about 70 to about 90 wt % aluminum particles and about 1 to about 10 wt % aluminum flakes. Given proportions of aluminum particles can be replaced with nodular aluminum. Alternatively the paste may comprise about 75 to about 90 wt % aluminum flakes and about 1 to about 10 wt % of colloidal aluminum, or about 60 to about 95 wt % of aluminum powder or aluminum flakes and about 0.1 to about 20 wt % of colloidal aluminum. Suitable commercial examples of aluminum particles are available from Alcoa, Inc., Pittsburgh, Pa.; Ampal Inc., Flemington, N.J.; and ECKA Granulate GmbH & Co. KG, of Fürth, Germany, and Goldsky, Jing Mao, China.

An alloy of aluminum may be used, including those comprising aluminum and another metal. Metals such as boron, silicon, gallium, indium, antimony, and magnesium are advantageous. In one embodiment, the alloy provides both aluminum and boron, namely, as an aluminum-boron alloy, which comprises about 60 to about 99.9 wt % aluminum and about 0.1 to about 40 wt % boron. In a preferred embodiment an aluminum-boron alloy containing 0.2 weight % B could be used for up to 98 wt % of the paste mixture to provide both aluminum and boron to the mixture. In yet another preferred embodiment, one or more of the alloys Al—Si, Al—Mg, Al—Ga, Al—In, Al—Sb, Al—Sn, and Al—Zn may constitute up to about 50 wt % of the mixture, preferably 0.1 to 40%, more preferably 0.2-30%.

Paste Preparation. The paste according to the present invention may be conveniently prepared on a planetary mixer. The amount and type of carriers utilized are determined mainly by the final desired formulation viscosity, fineness of grind of the paste, and the desired wet print thickness. In preparing compositions according to the present invention, the particulate inorganic solids are mixed with the vehicle and dispersed with suitable equipment, such as a planetary mixer or Hobart mixer, to form a suspension, resulting in a composition for which the viscosity will be in the range of about 1 to about 100 kcps, preferably about 10 to about 50 kcps, at a shear rate of 9.6 sec$^{-1}$ as determined on a Brookfield viscometer HBT, spindle 14, measured at 25° C.

Front contact silver pastes and back contact aluminum and back contact silver pastes are deposited and fired using a rapid thermal processing (RTP) furnace. Several methods are used to deposit front and back contact pastes. Back contact aluminum pastes are pad printed or screen printed with a thickness of about 15-30 microns. Typical firing cycle involves heating of solar cell in a RTP furnace such as Despatch Furnace (Ultraflex, Despatch Industries, Minneapolis, Minn., USA) where total firing cycle time is approximately 50-120 seconds using a travelling belt. The peak firing wafer temperature is about 750 to 950° C., preferably 800 to 900° C. for 1 to 20 seconds. Typically, solar cells are fired with silver side up and aluminum side facing the furnace belt and hence can lead to slight lower back side aluminum paste temperature due to rapid firing. Number of processing events occurs during the rapid firing of back contact aluminum paste. At lower temperature (<600° C.) solvents, organic binders and processing additives are removed by oxidation and formation of volatile products. Glass and other additives are also added to back contact aluminum pastes. Glass is expected to start softening above the glass transition temperature (Tg) of about 400-600° C. Aluminum powder particles (average size 1-30 microns) used in the back contact aluminum pastes have a native oxide layer (alumina-$Al_2O_3$) present. The thickness (about 0.01-20 nanometers) and structure of the oxide layer depends on the thermal history of the powders and the powder manufacturing route. The thickness of the oxide layer increases with increasing the temperature and exothermic oxide formation reaction can be observed just before melting point of aluminum using Differential Thermal Analysis (DTA), or Differential Scanning Calorimetry (DSC).

The role of glass and additives in aluminum back contact is not well understood and/or explained in the literature. It is generally believed that the glass will interact with the $Al_2O_3$ layer on the aluminum powder and will also help to improve the paste adhesion to silicon substrate. As the paste temperature increases, the solubility of silicon in aluminum increases reaching about 1 wt % at 500° C. and silicon rapidly diffuses into aluminum but aluminum has very limited solubility in silicon. There are significant differences between the thermal coefficient of expansion (TCE) of $Al_2O_3$ layer (78×10$^{-7}$/° C.) and that of the molten aluminum metal (232×10$^{-7}$/° C.). The TCE differences lead to thermal stresses which in turn lead to rupture of $Al_2O_3$ layer at various locations to form a continuous network of molten aluminum. Above the melting point of aluminum of about 660° C., the molten aluminum dissolves significant amount of silicon from the substrate. The amount of silicon dissolved into molten aluminum depends on the aluminum-silicon alloy melt temperature. The amount of silicon dissolved into molten aluminum is about 20 wt % at about 700° C. and about 28 wt % at 800° C. The amount of silicon dissolved in the aluminum-silicon melt is thus a strong function of the aluminum-silicon alloy temperature which is determined by the silicon wafer temperature. The amount of silicon dissolved into aluminum is critical in formation of back contact aluminum silicon contacts during subsequent cooling of the wafer. After reaching the peak firing temperature, the wafer is rapidly cooled. The solubility of the silicon in aluminum-silicon melt decreases with decrease in the wafer temperature. During cooling from the wafer maximum temperature to about 573° C., the excess silicon dissolved into the aluminum silicon melt is epitaxially deposited back on the silicon substrate to form a hyper eutectic silicon layer also know as Back Surface Field (BSF) layer. The BSF layer properties such as thickness and doping level of aluminum in the BSF layer are critical for improving the solar cell electrical properties. The thickness of the BSF layer (0.1-20 microns) and the doping of the BSF layer with aluminum (0.2 to $1\times10^{18}$ aluminum atoms/cm$^3$) is strongly dependent on the starting peak aluminum-silicon alloy temperature. At about 573° C., excess aluminum-silicon alloy melt freezes as a aluminum silicon eutectic alloy with about 11.7 wt % silicon. When the cooling melt reaches the Al—Si eutectic temperature the remaining liquid freezes as an Al—Si eutectic layer. A p+ layer is believed to provide a back surface field (BSF), which in turn increases the solar cell performance. Reliable and uniform contacts, thickness, and BSF electrical properties cannot be guaranteed because firing times are so short, (sometimes several seconds) and glass and metals have different heat capacities, and therefore heat at different rates. Solar cell electrical performance and adhesion between glass and metal in a contact could thus suffer. Hence a reliable method to heat the back contact is strongly desired to form high reliability, high electrical performance back aluminum contacts.

Method of Back Contact Production. A solar cell back contact according to the present invention can be produced by applying any Al paste disclosed elsewhere herein, produced by mixing aluminum powders, with the glass compositions of any table of glass formulations herein to the P-side of the silicon substrate pre-coated with silver rear contact paste, for example by screen printing, to a desired wet thickness, e.g., from about 30 to 50 microns. Front contact Ag pastes are then printed on the front side.

Common to the production of front contacts, back contacts and silver rear contacts is the following. Automatic screen-printing techniques can be employed using a 200-325 mesh screen. The printed pattern is then dried at 325° C. or less, preferably at about 250° C. for about 5-15 minutes before firing. The dry printed Al back contact paste of the present invention can be co-fired with the silver rear contact and the front contact silver pastes for as little as 1 second up to about 5 minutes at peak temperature, in a belt conveyor furnace in air.

Nitrogen ($N_2$) or another inert atmosphere may be used if desired, but it is not necessary. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute. Naturally, firing arrangements having more than 3 zones are envisioned by the present invention, including 4, 5, 6, or 7, zones or more, each with zone lengths of about 5 to about 20 inches and firing temperatures of 650 to 1000° C.

EXAMPLES

Exemplary Al formulations in Table 3 were made with commercially available glasses from Ferro Corporation, Cleveland, Ohio. Commonly available 2-10 micron aluminum powders were used.

TABLE 3

Exemplary Paste Formulations. Values in Weight Percent.

| Ingredient | A | B | C | D | E | F | G |
|---|---|---|---|---|---|---|---|
| Organic vehicle | 3 | 3 | 3 | 3 | 3 | 3 | 3 |
| Glass X | 0.2 | 0.2 | 0.2 | 0.2 | 0.2 | 0.2 | 0.2 |
| Glass Y | 0.8 | 0.8 | 0.8 | 0.8 | 0.8 | 0.8 | 0.8 |
| Glass Z | 0.8 | 0.8 | 0.8 | 0.8 | 0.8 | 0.8 | 0.8 |
| Vanadium additive | 0 | 0.5 | 0 | 0 | 0.25 | 0.25 | 0.25 |
| Cobalt additive | 0 | 0 | 0.5 | 0 | 0.5 | 0 | 0.5 |
| Strontium additive | 0 | 0 | 0 | 0.5 | 0 | 0.5 | 0.5 |
| Solvent | 17.45 | 16.95 | 16.95 | 16.95 | 16.70 | 16.70 | 16.70 |
| Dispersant | 0.25 | 0.25 | 0.25 | 0.25 | 0.25 | 0.25 | 0.25 |
| Filler | 1.50 | 1.50 | 1.50 | 1.50 | 1.50 | 1.50 | 1.50 |
| Aluminum powder 4-6 µm | 76.00 | 76.00 | 76.00 | 76.00 | 76.00 | 76.00 | 76.00 |

In the table, the following abbreviations are used for the additives. Vanadium additive: Vanadium 2-ethylhexanoate; Strontium additive: Strontium 2-ethylhexanoate; Cobalt additive: Cobalt oxide. All are commercially available through Alfa Aesar, Ward Hill, Mass., USA.

All Al pastes were printed on 5 inch Square (148.25 cm$^2$) silicon monocrystalline wafers having a thickness of 200 microns. The silver paste used for front contacts is commercially available NS 33-510 from Ferro Corporation. Photovoltaic cells were fired in a Despatch furnace using profile 400-400-500-700-800-880° C.@200 ipm. Electrical performance of some of these solar cells was measured with a solar tester, Model NCT-M-180A, NPC Inc, Tokyo, Japan under AM 1.5 sun conditions, in accordance with ASTM G-173-03. The electrical properties of the resultant solar cells are set forth in Table 4, which shows the improvement in open circuit voltage with the addition of Vanadium, cobalt and Strontium additives. The glasses have the following formulas in mole percent. Glass X has a formula of 35.8% $Bi_2O_3$, 35.5% $SiO_2$, 7.2% $B_2O_3$, 21.5% $K_2O$. Glass Y is 81.5% $SiO_2$, 16.89% $B_2O_3$, 1.39% $K_2O$ and 0.20% $Na_2O$. Glass Z is 1.86% $Al_2O_3$; 20.86% $B_2O_3$; 0.75% $K_2O$; 10.43% $Na_2O$; 21.02% $SiO_2$; 3.16% $TiO_2$; 26.10% ZnO; 2.56% $ZrO_2$ and 13.26% F.

TABLE 4

Comparison of Al-paste fired back contacts.

| Al pastes | Voc (V) |
|---|---|
| A | 0.617 |
| B | 0.621 |
| C | 0.618 |
| D | 0.620 |
| E | 0.623 |
| F | 0.625 |
| G | 0.623 |

Figure 2:
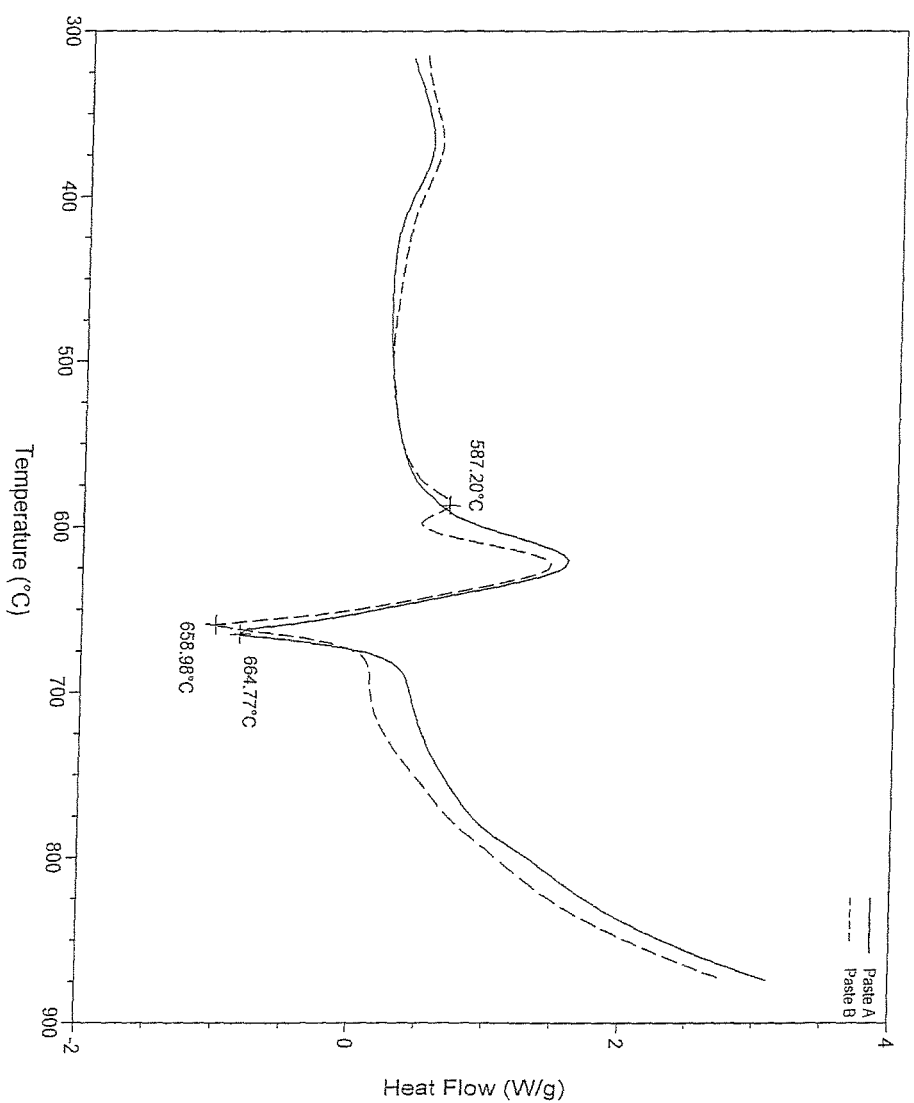
FIG. 2. Overlay DSCs of pastes A and B.

As noted in FIG. 1, the Exothermic peak indicating the reaction between aluminum and the Vanadium 2-ethylhexanoate additive, is some 80° C. lower (earlier) than the reaction without the additive. Hence the additive provides heat to the reaction system. As noted in FIG. 2, Differential Scanning Calorimetry of exemplary pastes A (no additives) and B (Vanadium additive) shows an earlier onset of a reaction prior to Al melting and subsequent lowering of Al melting temperature by 5° C.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A method of improving the electrical performance of an aluminum back contacted silicon solar cell, comprising:
    a. providing a silicon wafer substrate;
    b. providing a paste comprising:
        i. about 60-95 wt % of aluminum;
        ii. glass frit, and
        iii. a separate and distinct amount of at least one metal compound, wherein (a) the metal in the compound is selected from the group consisting of Co, Sr, V, and combinations thereof, and (b) the at least one metal compound is not in the form of a phosphate,
    c. applying the paste to the silicon wafer substrate to form a coated substrate, and
    d. firing the coated substrate for a time and at a temperature sufficient to sinter the aluminum and fuse the glass fit and at least one metal.

2. The method of claim 1, wherein the at least one metal compound is provided in a form of an organic compound or an organic compound.

3. The method of claim 2, wherein the at least one metal compound is provided in the form of an inorganic compound selected from the group consisting of salt, oxide, chloride, bromide, nitrate, carbide, nitride, silicide, and combinations thereof.

4. The method of claim 2, wherein the at least one metal compound is provided in the form of an organic compound having from 1 to 6 hydrocarbon residues, the residues independently having from 1 to 30 carbon atoms.

5. The method of claim 4, wherein the organic compound is an organometallic compound including (a) one or more metal centers and (b) one or more hydrocarbon residues having at least one of (i) 1-5 carbons, (ii) 6-10 carbons, (iii) 11-15 carbons, (iv) 16-20 carbons, (v) 21-25 carbons or (vi) 26-30 carbons.

6. The method of claim 4, wherein the organic compound is an organometallic compound including (a) one or more metal centers and (b) one or more hydrocarbon residues having at least one of (i) 1-7 carbons, (ii) 8-12 carbons, (iii) 13-17 carbons, (iv) 18-22 carbons, (v) 23-27 carbons or (vi) 28-30 carbons.

7. The method of claim 4, wherein the at least one metal is provided in the form of an organometallic compound selected from the group consisting of $C_1C_5$ organometallics, $C_6$-$C_{10}$ organometallics, $C_{11}$-$C_{15}$ organometallics, $C_{16}$-$C_{20}$ organometallics and $C_{26}$-$C_{30}$ organometallics.

8. The method of claim 4, wherein the at least one metal is provided in the form of an organometallic compound selected from the group consisting of $C_2$-$C_7$ organometallics, $C_8$-$C_{12}$ organometallics, $C_{13}$-$C_{17}$ organometallics, $C_{18}$-$C_{22}$ organometallics, $C_{23}$-$C_{27}$ organometallics and $C_{28}$-$C_{30}$ organometallics.

9. The method of claim 2, wherein a sufficient amount of the organic compound or inorganic compound is present in order to provide 100 ppmw to 10 wt % of the metal.

10. The method of claim 2, wherein a sufficient amount of the organic compound or inorganic compound is present in order to provide 500 ppmw to 8 wt % of the metal.

11. The method of claim 2, wherein a sufficient amount of the organic compound or inorganic compound is present in order to provide 1000 ppmw to 7 wt % of the metal.

12. The method of claim 2, wherein a sufficient amount of the organic compound or inorganic compound is present in order to provide 0.05 wt % to 5wt % of the metal.

13. The method of claim 2, wherein a sufficient amount of the organic compound or inorganic compound is present in order to provide 0.1 wt % to 5 wt % of the metal.

14. The method of claim 2, wherein a sufficient amount of the organic compound or inorganic compound is present in order to provide 0.25 wt % to 4 wt % of the metal.

15. A solar cell including a contact made by the method of claim 1.

16. The method of claim 1, wherein the glass frit comprises
    a. 15-55 mol % $Bi_2O_3$,
    b. 15-55 mol % $SiO_2$,
    c. 1-15 mol % $B_2O_3$, and
    d. 5-35 mol % ($Li_2O+Na_2O+K_2O$).

17. The method of claim 1, wherein the glass frit comprises
    a. 20-55 mol % $Bi_2O_3$,
    b. 20-55 mol % $K_2O$,
    c. 0.1-5 mol % $P_2O_5$ and
    d. 1-6 mol % $SiO_2$.

18. The method of claim 1, wherein the glass frit comprises
    a. 10-25 mol % $B_2O_3$,
    b. 0.5-30 mol % $K_2O$,
    c. 0.01-0.50 mol % $Na_2O$, and
    d. 70-90 mol % $SiO_2$.

19. The method of claim 1, wherein the glass frit comprises:
    a. 5-15 mol % $K_2O$,
    b. 1-8 mol % $Li_2O$,
    c. 16-28 mol % $Na_sO$,
    d. 0.2-4 mol % $P_2O_5$,
    e. 30-50 mol % $SiO_2$,
    f. 15-35 mol % $TiO_2$,
    g. 1-6 mol % $V_2O_5$.

20. The method of claim 1, wherein the paste comprises vanadium or cobalt.

21. The method of claim 1, wherein the paste comprises (i) vanadium and (ii) one or both of cobalt and strontium.

22. A method of at least one (I) reducing bow and (II) improving the electrical performance of an aluminum back contacted silicon solar cell, comprising:
    a. providing a silicon wafer substrate,
    b. applying to the substrate a paste comprising:
        i. about 60-95 wt % of aluminum,
        ii. an organometallic compound, and
        iii. a glass frit, to form a coated substrate, wherein the organometallic compound is a $C_1$ to $C_{30}$ organometallic compound of a metal selected from the group consisting of Co, Sr, V, and combinations thereof, such that the paste has an exothermic reaction peak at a temperature of at least 300° C. to less than 660° C. with a sample size of 5 to 200 mg when measured with differential scanning calorimetry at a heating rate of 20° C. per minute in air,
    c. firing the coated substrate,
    d. applying the paste to the silicon wafer substrate to form a coated substrate, and
    e. firing the coated substrate for a time and at a temperature sufficient to sinter the aluminum and fuse the glass fit and organometallic compound.

23. The method of claim 22, wherein the combination of aluminum, glass frit and organometallic compound is such that the sintering temperature of the paste is at least 20° C. lower than it would otherwise be if the organometallic compound were not present.

24. The method of claim 22, wherein the combination of aluminum, glass frit and organometallic compound is such that the sintering temperature of the paste is at least 10° C. lower than it would otherwise be if the organometallic compound were not present.

25. The method of claim 22, wherein the combination of aluminum, glass frit and organometallic compound is such that the sintering temperature of the paste is at least 3° C. lower than it would otherwise be if the organometallic compound were not present.

26. An aluminum paste, comprising:
   about 60-95 wt % of aluminum, and
   at least one compound of a metal selected from the group consisting of Co, Sr, V and combinations thereof, wherein the at least one compound is not in the form of a phosphate.

27. A method of improving the electrical performance of an aluminum back contacted silicon solar cell, comprising:
   a. providing a silicon wafer substrate
   b. providing a paste comprising:
      i. about 60-95 wt % of aluminum,
      ii. glass frit, and
      iii. a separate and distinct amount of a compound that supplies at least one of Co, Sr, and V, wherein the compound is not in the form of a phosphate,
   c. selecting a sufficient amount of such compound such that the paste provides an exothermic reaction peak, when measured with differential thermal analysis at a heating rate of 20 C per minute in air, at a temperature of at least 660 C to less than 900 C, with a sample size of 5 to 200 mg,
   d. applying the paste to the silicon wafer substrate to form a coated substrate, and
   e. firing the coated surface for a time and at a temperature sufficient to sinter the aluminum and fuse the glass fit and the compound.

28. A method of improving the electrical performance of an aluminum back contacted silicon solar cell, comprising:
   a. providing a silicon wafer substrate;
   b. providing a paste comprising:
      i. about 60-95 wt % of aluminum;
      ii. glass frit, and
      iii. a separate and distinct amount of at least one metal provided in the form of an organic compound or an inorganic compound, selected from the group consisting of Co, Sr, V, and combinations thereof, wherein a sufficient amount of the organic compound or inorganic compound is present in order to provide 100 ppmw to 10 wt % of the metal,
   c. applying the paste to the silicon wafer substrate to form a coated substrate, and
   d. firing the coated substrate for a time and at a temperature sufficient to sinter the aluminum and fuse the glass frit and at least one metal.

\* \* \* \* \*